(12) United States Patent
Cornew et al.

(10) Patent No.: US 10,407,153 B2
(45) Date of Patent: Sep. 10, 2019

(54) HIGH ALTITUDE AIRCRAFT WITH INTEGRATED SOLAR CELLS, AND ASSOCIATED SYSTEMS AND METHODS

(71) Applicant: X Development LLC, Mountain View, CA (US)

(72) Inventors: Daniel H. Cornew, Moriarty, NM (US); Maximus Yaney, Moriarty, NM (US)

(73) Assignee: WING AVIATION LLC, Mountain View, CA (US)

( * ) Notice: Subject to any disclaimer, the term of this patent is extended or adjusted under 35 U.S.C. 154(b) by 0 days.

(21) Appl. No.: 15/889,841

(22) Filed: Feb. 6, 2018

(65) Prior Publication Data

US 2018/0178898 A1 Jun. 28, 2018

Related U.S. Application Data

(62) Division of application No. 14/310,415, filed on Jun. 20, 2014, now Pat. No. 9,957,037.
(Continued)

(51) Int. Cl.
*B64C 3/32* (2006.01)
*H01L 31/042* (2014.01)
(Continued)

(52) U.S. Cl.
CPC .............. *B64C 3/32* (2013.01); *B64C 39/024* (2013.01); *B64D 27/24* (2013.01); *H01L 31/02008* (2013.01); *H01L 31/0216* (2013.01); *H01L 31/042* (2013.01); *H01L 31/048* (2013.01); *H01L 31/0475* (2014.12); *H01L 31/18* (2013.01); *H02S 10/40* (2014.12); *B64C 2201/042* (2013.01); *B64D 2211/00* (2013.01);
(Continued)

(58) Field of Classification Search
None
See application file for complete search history.

(56) References Cited

U.S. PATENT DOCUMENTS 3,868,073 A * 2/1975 King .................... B64C 39/066
244/34 A
3,998,659 A 12/1976 Wakefield
(Continued)

FOREIGN PATENT DOCUMENTS

CN 101192630 A 6/2008
CN 101506995 A 8/2009
(Continued)

OTHER PUBLICATIONS

CN 201480039146.5—Notification of Fourth Office Action, dated Dec. 25, 2017, 6 pages.
(Continued)

*Primary Examiner* — Eli S Mekhlin
(74) *Attorney, Agent, or Firm* — Christensen O'Connor Johnson Kindness PLLC

(57) ABSTRACT

An aircraft includes a substrate having a curvature to form a lift surface, a plurality of solar cells carried by, bonded to, and impressed into the substrate, and electrical connections between the solar cells carried by the substrate. The electrical connections coupled to link the solar cells together to provide power to the aircraft while in flight.

14 Claims, 10 Drawing Sheets

Related U.S. Application Data

(60) Provisional application No. 61/844,786, filed on Jul. 10, 2013.

(51) Int. Cl.
| | |
|---|---|
| *H01L 31/048* | (2014.01) |
| *B64C 39/02* | (2006.01) |
| *B64D 27/24* | (2006.01) |
| *H01L 31/0475* | (2014.01) |
| *H02S 10/40* | (2014.01) |
| *H01L 31/02* | (2006.01) |
| *H01L 31/0216* | (2014.01) |
| *H01L 31/18* | (2006.01) |

(52) U.S. Cl.
CPC ............... *Y02E 10/50* (2013.01); *Y02T 50/44* (2013.01); *Y02T 50/55* (2018.05); *Y02T 50/62* (2013.01)

(56) References Cited

U.S. PATENT DOCUMENTS

| | | |
|---|---|---|
| 4,717,790 A | 1/1988 | Gochermann |
| 5,419,782 A | 5/1995 | Levine et al. |
| 5,518,205 A | 5/1996 | Wurst et al. |
| 6,505,795 B1 | 1/2003 | Thompson et al. |
| 6,550,717 B1 | 4/2003 | MacCready et al. |
| 6,706,959 B2 | 3/2004 | Hamakawa et al. |
| 6,762,359 B2 | 7/2004 | Asai et al. |
| 6,931,247 B2 | 8/2005 | Cox et al. |
| 7,198,225 B2 | 4/2007 | Lisoski et al. |
| 7,281,081 B1 | 10/2007 | Ohr |
| 7,802,756 B2 | 9/2010 | Kendall et al. |
| 2002/0005457 A1 | 1/2002 | Lee et al. |
| 2003/0005954 A1 | 1/2003 | Emoto et al. |
| 2004/0112423 A1 | 6/2004 | Suzuki et al. |
| 2004/0112424 A1 | 6/2004 | Araki et al. |
| 2006/0043390 A1 | 3/2006 | Nakata |
| 2007/0074755 A1 | 4/2007 | Eberspacher et al. |
| 2008/0185033 A1* | 8/2008 | Kalejs ................. H01L 31/0516 136/246 |
| 2009/0134273 A1 | 5/2009 | Page et al. |
| 2011/0001001 A1 | 1/2011 | Bryant |
| 2012/0091263 A1 | 4/2012 | Parks |
| 2012/0305080 A1 | 12/2012 | Funavama et al. |
| 2013/0104966 A1 | 5/2013 | Grip et al. |
| 2014/0224298 A1* | 8/2014 | Grimsley ................. B64C 3/00 136/246 |

FOREIGN PATENT DOCUMENTS

| | | |
|---|---|---|
| CN | 102379045 A | 3/2012 |
| CN | 102760777 A | 10/2012 |
| JP | 03204979 A | 9/1991 |
| JP | 2002083992 A | 3/2003 |
| KR | 20110060604 A | 6/2011 |
| WO | 01/587567 A2 | 8/2001 |
| WO | 2007/041533 A2 | 4/2007 |
| WO | 2009/095696 A2 | 8/2009 |

OTHER PUBLICATIONS

CN 201480039146.5—Notification of Third Office Action, dated Sep. 26, 2017, 25 pages.
EP 14850903.7—Extended European Search Report, dated May 26, 2017, 11 pages.
CN 201480039146.5, Second Office Action with English Translation, dated Mar. 27, 2017, 14 pages.
EP 14850903—Supplemental Partial European Search Report, dated Feb. 13, 2017, 7 pages.
Boyle, Alan, "Solar Impulse plane ends American odyssey with fears, tears and cheers", NBCNews.com, Science, NBC News, Jul. 6, 2013, 6 pages.
CN 201480039146.5—First Office Action with English translation, dated Aug. 1, 2016, 24 pages.
PCT/US2014/045286—PCT International Search Report and Written Opinion of the International Searching Authority, dated Apr. 28, 2015, 13 pages.
PCT/US2014/045286, PCT International Preliminary Report on Patentability, dated Jan. 21, 2016, 10 pages.
Examination Report for Indian Patent Application No. 201647003770 dated Jan. 9, 2019, 6 pages.

* cited by examiner

_HIGH ALTITUDE AIRCRAFT WITH INTEGRATED SOLAR CELLS, AND ASSOCIATED SYSTEMS AND METHODS_

CROSS-REFERENCE TO RELATED APPLICATIONS

This application is a divisional of U.S. application Ser. No. 14/310,415, filed 20 Jun. 2014 (U.S. Pat. No. 9,957,037 issued May 1, 2018), which in turn claims priority under the provisions of 35 U.S.C. § 119(e) to U.S. Provisional Application No. 61/844,786, filed Jul. 10, 2013, the contents both of which are incorporated by reference herein in their entirety.

TECHNICAL FIELD

The present technology is directed generally to high altitude aircraft with integrated solar cells, and associated systems and methods.

BACKGROUND INFORMATION

Unmanned air vehicles (UAVs) have proliferated recently because they can perform a variety of valuable tasks without incurring the costs and risks associated with a piloted aircraft. Typical UAV tasks include surveillance and communication tasks. However, one drawback with many existing UAVs is that they have limited endurance and can accordingly remain on-station for only a limited period of time. As a result, it can be difficult to provide the foregoing tasks consistently for an extended period of time.

One approach to addressing the foregoing endurance issues is to provide solar power to a UAV, potentially enabling the UAV to remain on-station for extended periods of time because it generates the power it requires while in flight. However, such systems tend to be heavy and/or expensive, both of which factors make it difficult to provide surveillance, communications, and/or other services at a competitive price. Accordingly, there remain unmet needs for providing long endurance, unmanned air vehicle services at competitive rates.

DETAILED DESCRIPTION

The present technology is directed generally to high altitude aircraft with integrated solar cells, and associated systems and methods. Specific details of several embodiments of the disclosed technology are described below with reference to particular aircraft configurations and solar cell configurations, but in other embodiments, representative systems can include aircraft and/or solar cells having different configurations than those described below. Several details describing structures and/or processes that are well-known and often associated with high altitude unmanned aircraft and/or solar cell arrangements, but that may unnecessarily obscure some significant aspects of the present technology, are not set forth in the following description for purposes of clarity. Moreover, although the following disclosure sets forth several embodiments of different aspects of the presently disclosed technology, several other embodiments of the technology can have configurations and/or components different than those described in this section. Accordingly, the presently-disclosed technology may have other embodiments with additional elements, and/or without several of the elements described below with reference to FIGS. 1A-4C.

Figure 1A:
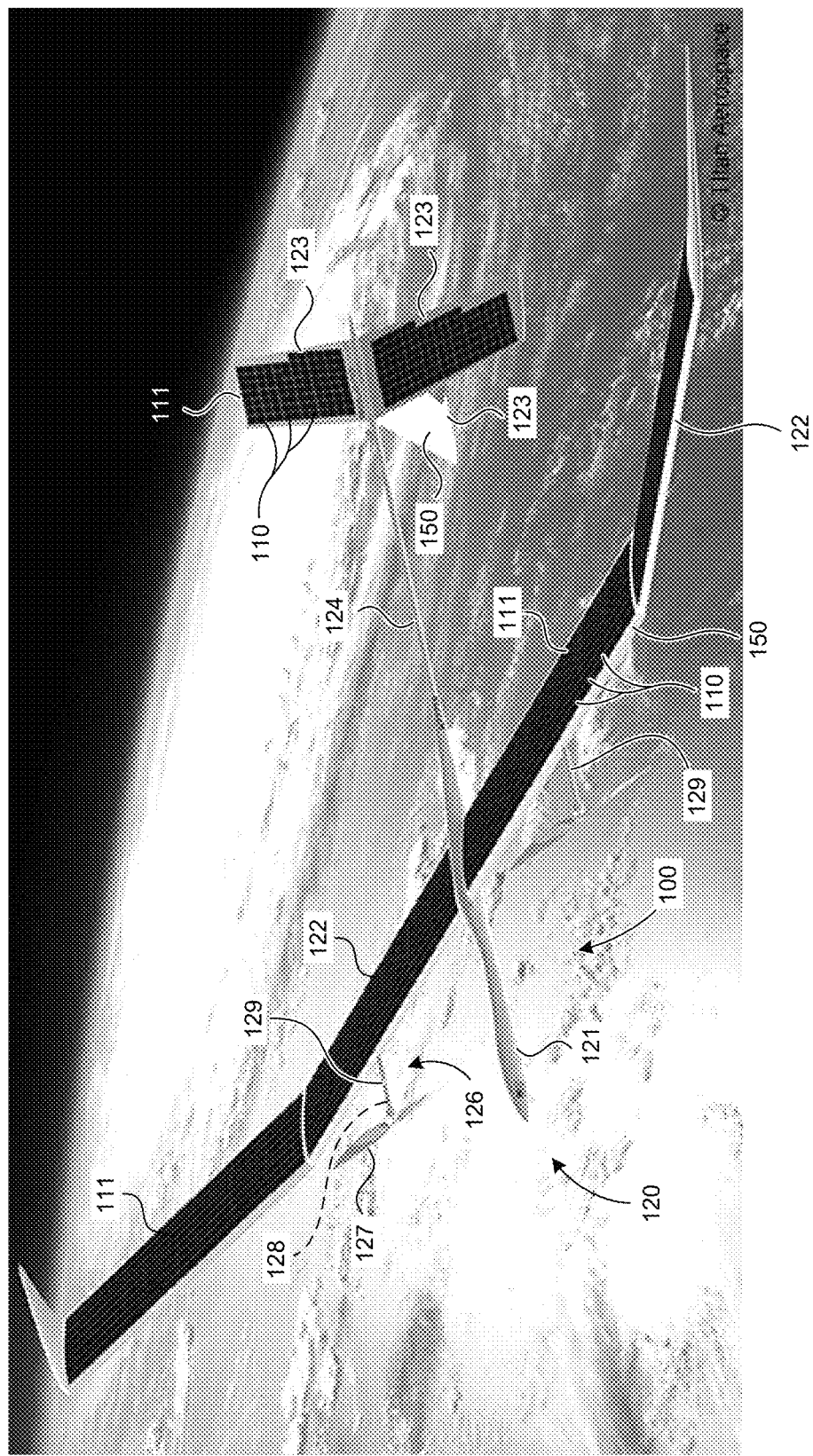
FIGS. 1A and 1B are partially schematic, isometric illustration of unmanned air vehicle systems having solar cells integrated in accordance with an embodiment of the present technology.

FIG. 1A is a partially schematic side elevation view of an aerospace system 100 that includes an aircraft 120 configured in accordance with an embodiment of the present technology. The aircraft 120 can be particularly configured to fly at very high altitudes (e.g., just within the earth's atmosphere) under power produced by multiple solar cells 110. In a particular embodiment, the aircraft 120 includes a narrow, elongated fuselage 121 coupled to one or more wings 122 or other lifting surfaces. The wings 122 can have a high aspect ratio with a significant dihedral or polyhedral e.g., suitable for low-speed, high altitude, long endurance flight. The aircraft 120 can further include a stabilizer boom or empennage 124 carrying one or more stabilizers 123 that provide stability and control functions. The aircraft 120 can still further include a propulsion system 126, which can in turn include one or more nacelles 129, each of which houses an electric motor 128 that powers a corresponding propeller 127.

Power for the propulsion system 126 is provided by the solar cells 110. The solar cells 110 can be arranged in a plurality of panels or arrays 111 that are carried by the aircraft 120. Elements of the aircraft (e.g., the wings 122 and/or the stabilizers 123) can include one or more substrates 150. In particular embodiments, as will be discussed in greater detail below, the solar cells 110 (individually, in panel form, and/or in other forms) can be integrated with the underlying substrate 150 to improve the manufacturability, cost performance, and/or structural efficiency of the aircraft 120.

Figure 1B:
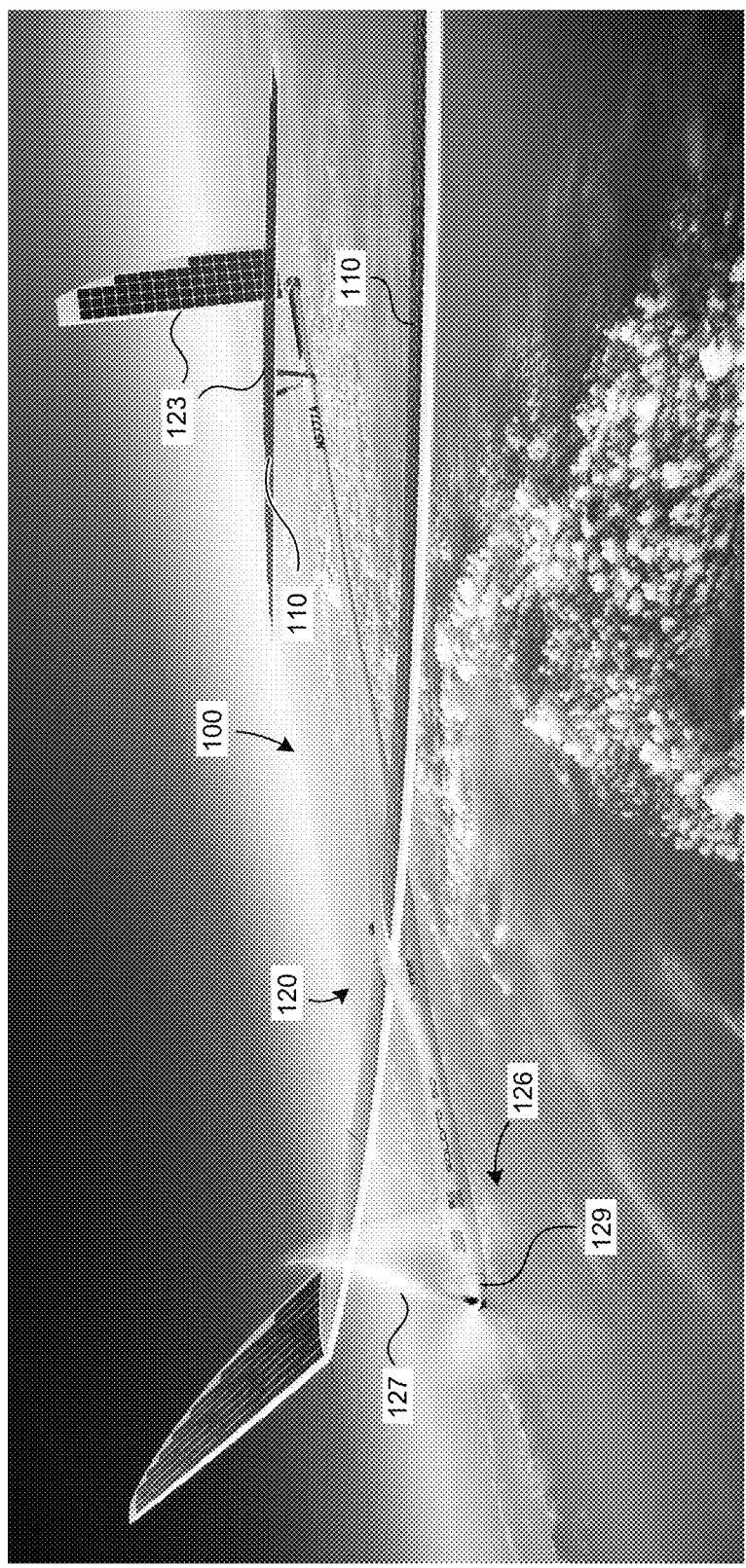

FIG. 1B is a partially schematic side elevation view of an aerospace system 100 that includes an aircraft 120 having a different configuration than that shown in FIG. 1A. For example, the propulsion system 126 includes a single nacelle 129 and a single propeller 127, and the stabilizers 123 are oriented orthogonal to each other. The solar cells 110 are integrated with the aircraft structure in a manner identical to or generally similar to that of the aircraft 120 shown in FIG. 1A. FIGS. 2-4C illustrate further details of representative integration techniques, as described below.

Figure 2:
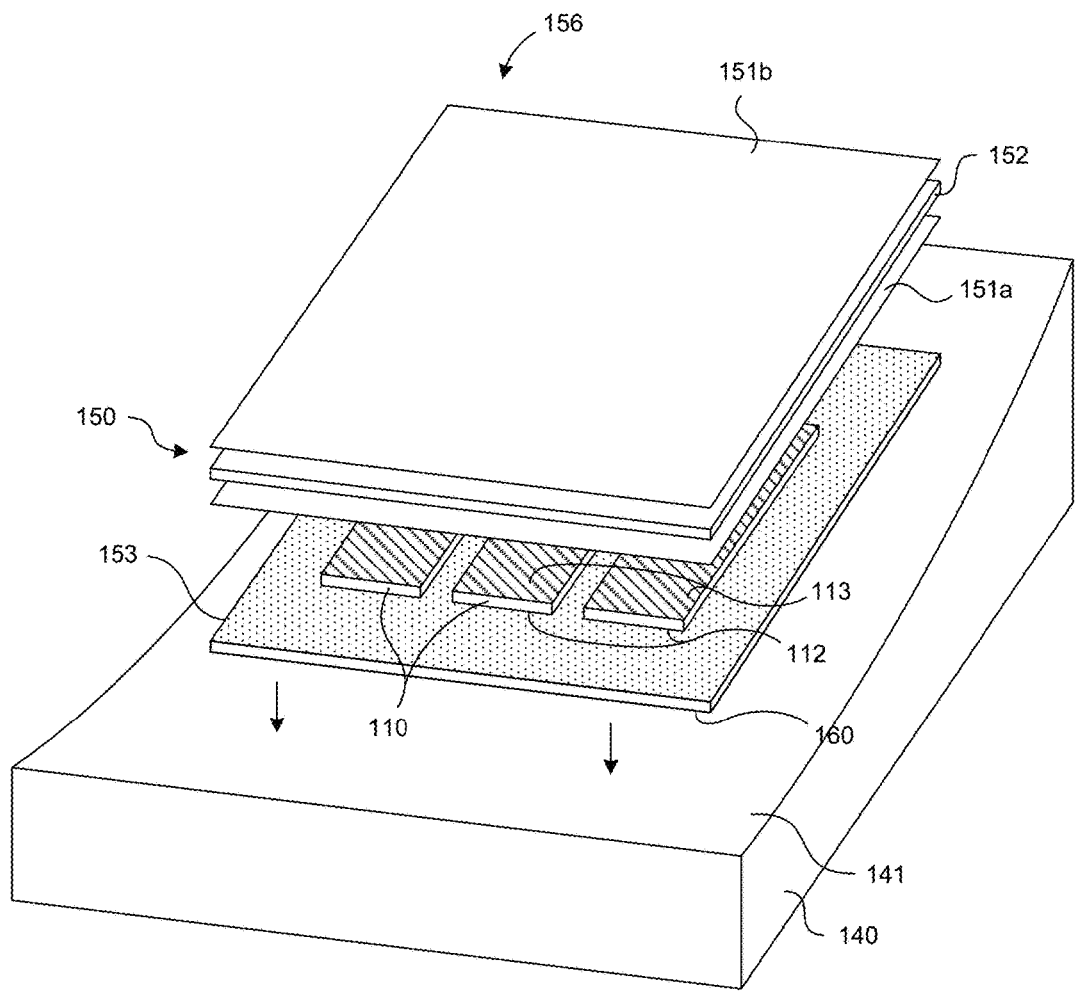
FIG. 2 is a partially exploded illustration of an aircraft substrate having solar cells integrated in accordance with an embodiment of the present technology.

FIG. 2 is a partially exploded, isometric illustration of a portion of a solar cell assembly 156 configured in accordance with a representative embodiment of the present technology. The assembly 156 can include the substrate 150, which carries multiple solar cells 110. Optionally, the assembly 156 can further include a protective cover 153. The cover 153 can be placed over the outwardly facing first or active surfaces 112 of the solar cells 110 to protect the active surfaces 112 from erosion and/or other environmental degradation factors. The solar cells 110 have an oppositely-facing second or back surface 113 that is attached to the substrate 150. The substrate 150 can have a composite construction. In a particular embodiment, the substrate 150 can include first and second sheets 151a, 151b positioned on opposite sides of a central core 152. In other embodiments, the composite structure of the substrate 150 can have other physical arrangements within the scope of the present technology.

In a representative embodiment, the solar cells 110 are integrated with the substrate 150 as part of the manufacturing process for forming the substrate 150. The resulting structure can be a unitary structure, e.g., one for which the solar cells 110 are bonded intimately with the substrate 150. For example, as shown in FIG. 2, the elements forming the assembly 156 can be built up in a stacked fashion on a mold element 140. The mold element 140 can accordingly include a smooth inner mold surface 141 that receives the stacked components forming the assembly 156. The surface of the assembly 156 positioned against the inner mold surface 141 forms an outwardly-facing, aerodynamic surface 160 of the aircraft 120 shown in FIG. 1. For example, the outwardly-facing surface 160 of the assembly 156 can form the upwardly or outwardly facing exposed portion of the wings 122 and/or the stabilizers 123 shown in FIG. 1. A representative process for forming the assembly 156 is described further below with reference to FIGS. 3A-3D. For purposes of illustration, only portions of representative larger assemblies 156 (e.g., sized to form an entire wing surface or a large section of such a surface) are shown in FIGS. 3A-3D.

Figure 3A:
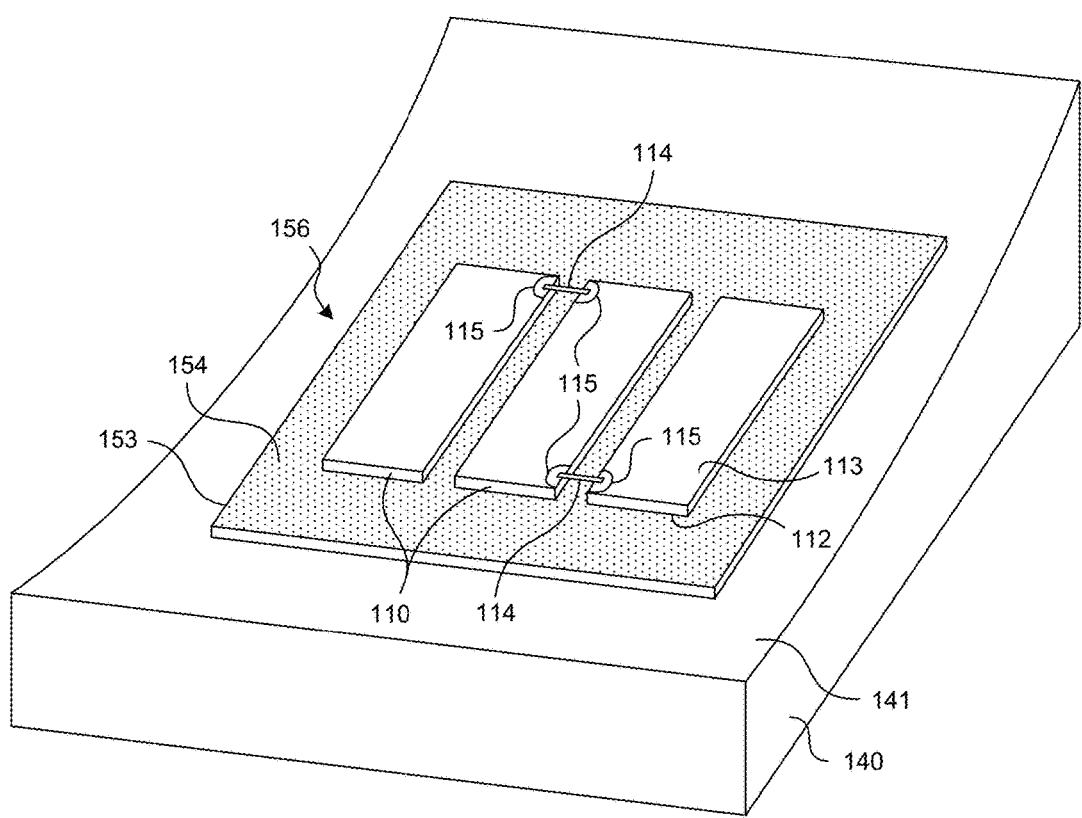
FIGS. 3A-3D illustrate a representative process for integrating solar cells with an aircraft substrate in accordance with the present technology.

Beginning with FIG. 3A, the mold element 140 (and in particular the inner mold surface 141) can be shaped in a manner that corresponds to the desired shape of the external surface carrying the solar cells 110. For example, the inner mold surface 141 can have a profile that produces the curved surfaces of the wings 122 or stabilizers 123 shown in FIG. 1. The illustrated inner mold surface 141 can be shaped to produce an upper wing surface, and a complementary mold element (not shown in FIG. 3A) can have an inner mold surface for forming the lower wing surface. The resulting wing halves can then be bonded together (e.g., at the leading and trailing edges) to form a complete wing.

In other embodiments, the surfaces can be formed in accordance with other techniques. For example, the inner mold surface 141 can be flat, and the resulting assembly 156 can be flexible enough to be laid over a set of curved ribs or other supports. The assembly 156 (or multiple bonded assemblies 156) can then be post-cured at elevated temperatures to harden the assemblies 156 into the final curved shape.

In a particular embodiment in which the protective cover 153 is used to protect the solar cells 110, the cover 153 can be laid face-down on the inner mold surface 141. In particular embodiments, the mold surface 141 is polished and/or waxed or otherwise treated to create a surface that the cover 153 and/or other elements forming the assembly will not stick to. The protective cover 153 can include a first adhesive 154 facing upwardly, away from the inner mold surface 141. The protective cover 153 and the first adhesive 154 can be transparent, at least at the wavelengths that activate the electrical current generation function of the solar cells 110. The solar cells 110 can then be laid face down onto the protective cover 153, with the active surfaces 112 in contact with the first adhesive 154.

The back or second surfaces 113 (facing upwardly in FIG. 3A) of the solar cells 110 can carry one or more contacts 115 (e.g., pads, terminals, or other structures) for conveying the electrical current generated by the solar cell 110. The manufacturing process can include attaching electrical connectors 114 to the back surfaces 113 at the contacts 115 (e.g., via a solder joint or other suitable joint) to transmit current from one solar cell 110 to another. The solar cells 110 can be connected electrically in parallel or in series, depending upon the target voltage and current requirements for a particular array of solar cells 110. In a typical installation, some solar cells 110 may be arranged in parallel, and others in series. The overall electrical system, which includes the solar cells 110 and the electrical connectors 114, can also include blocking diodes and/or other circuit elements to control the flow of electrical current among the solar cells 110.

Figure 3B:
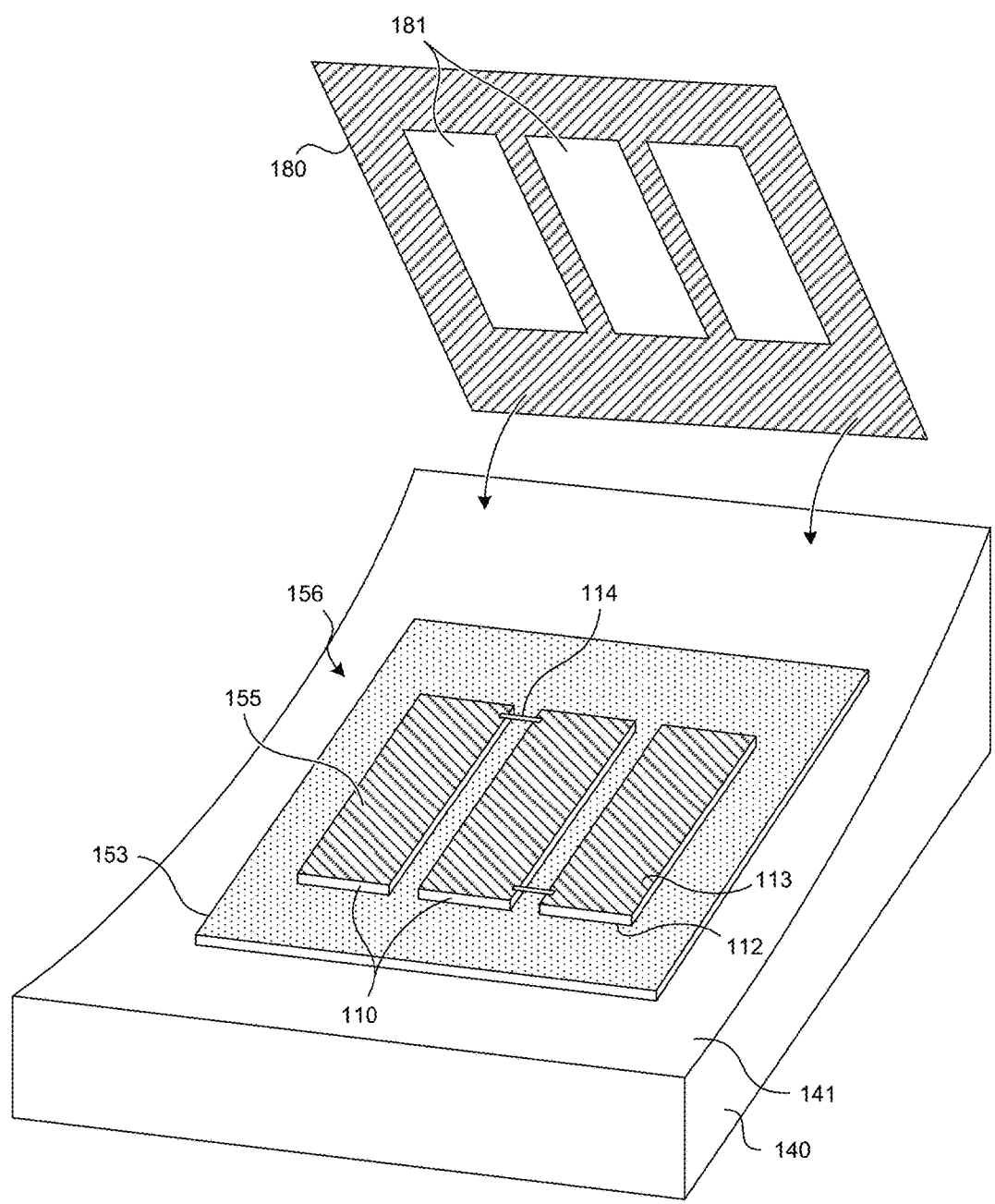

In FIG. 3B, a second adhesive 155 has been applied to the back surfaces 113 of the solar cells 110. Depending upon the embodiment, the second adhesive 155 can be applied with a brush, and/or can take the form of a film, and/or a spray. In a particular embodiment, (for example, when the second adhesive 155 is sprayed on to the solar cells 110), the process of applying the second adhesive 155 can include placing a mask 180 over the assembly 156. The mask 180 can include mask apertures or openings 181 that align with the back surfaces 113 of the solar cells 110, allowing the adhesive to deposit on the back surfaces 113, without depositing on other surfaces (e.g., the inner mold surface 141). In other embodiments, the mask 180 can be eliminated and the second adhesive can be applied to the back surfaces 113 and possibly the exposed first adhesive 154 as well.

Figure 3C:
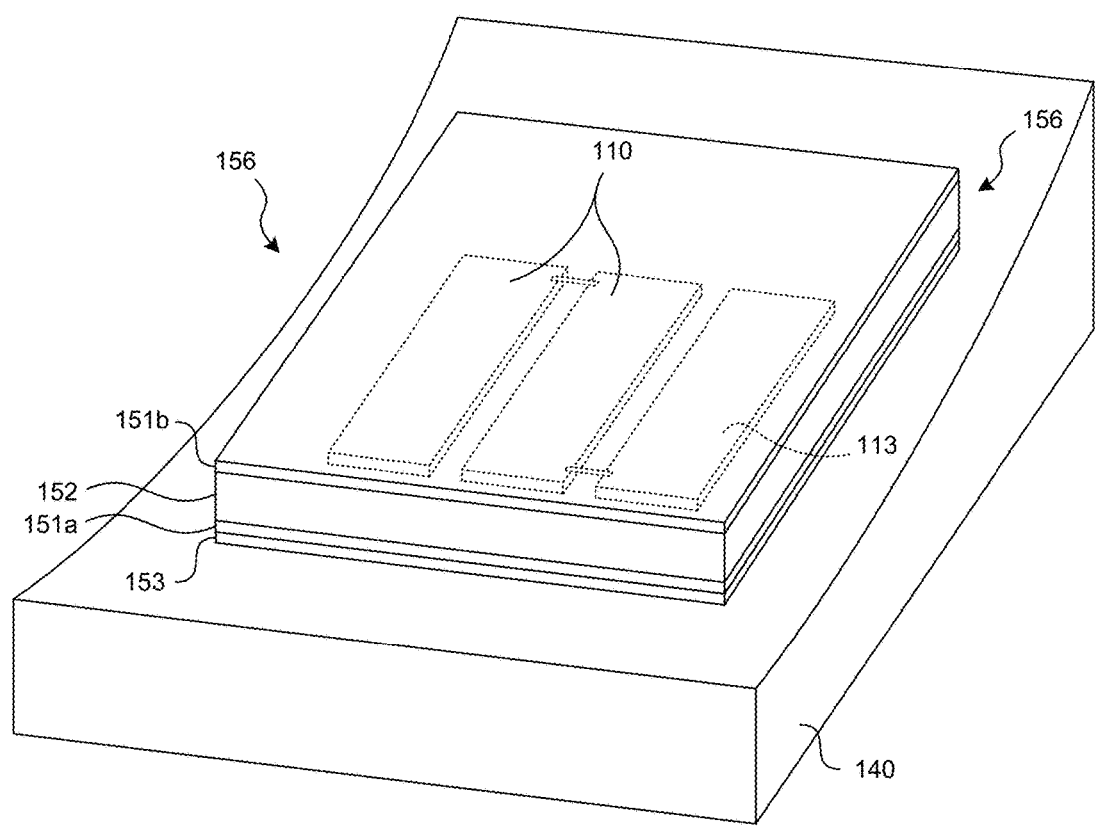

In FIG. 3C, the remaining elements of the assembly 156 have been positioned on the exposed first adhesive 154 (carried by the protective sheet 153 and visible in FIG. 3B) and the exposed second adhesive 155 (carried by the back surfaces 113 of the solar cells 110 and visible in FIG. 3B). The remaining elements can include a first sheet 151a, a second sheet 151b, and a core 152 positioned between the first and second sheets 151a, 151b. The first and second sheets 151a, 151b can include a fabric, for example, a glass ply fabric or a carbon ply fabric. Each sheet can include a single ply or multiple plies. The fabric can be woven or unwoven, and can be pre-impregnated with an epoxy or another adhesive (in a "pre-preg" form). In other embodiments, the epoxy or other adhesive can be disposed on the first sheet, the second sheet, and/or the core (e.g., using a wetting-out process), prior to consolidating the elements of the assembly 156. The core 152 can include a foam core, a honeycomb core or another suitable core, made from fiberglass, aluminum, and/or other suitable low cost, lightweight materials.

Figure 3D:
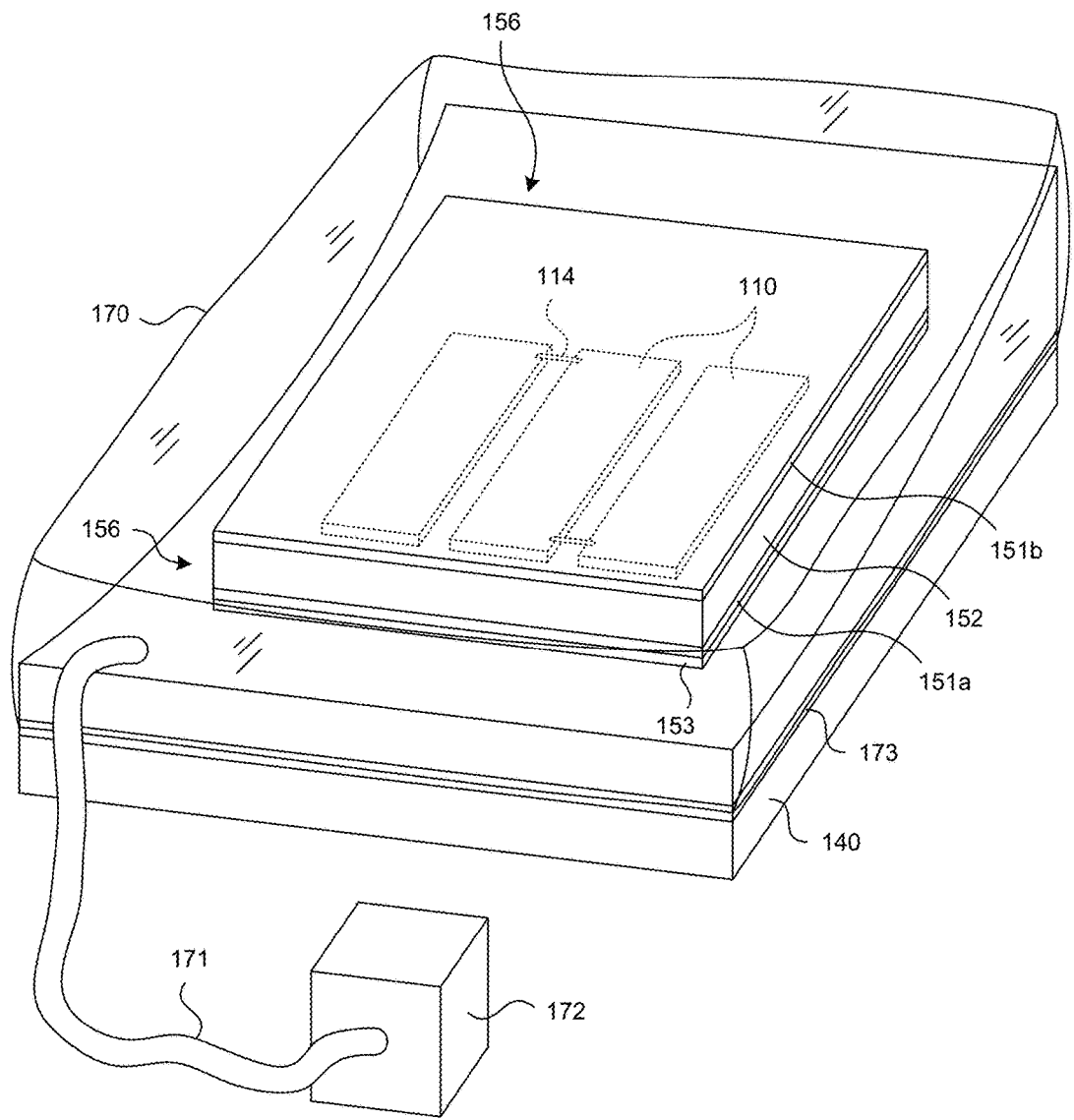

In FIG. 3D, a vacuum bag 170 has been placed over the assembly 156, and has been sealed to the mold element 140 using a sealant tape 173 or other suitable sealant. Suitable breathers and release films (not shown in FIG. 3D) are used to control the flow of epoxy and/or other resins, adhesives, or matrix materials under vacuum. The vacuum bag 170 is attached to a vacuum source 172 via a vacuum line 171. The manufacturing process can then include drawing a vacuum on the volume interior to the vacuum bag 170, thereby compressing and consolidating the elements of the assembly 156. The assembly 156 can, while under vacuum, be exposed to an elevated temperature (e.g., in a suitable oven or autoclave) to cure the epoxy and/or other adhesive materials that form the bonds between the elements of the assembly 156.

In a typical arrangement, the entire assembly 156 is bonded and co-cured simultaneously. In particular, the first and second sheets 151a, 151b, the intermediate core 152, the solar cells 110, and the electrical connectors 114 (along with other circuit elements, where appropriate) are cured simultaneously. The protective cover 153 can be applied afterwards, or can be co-cured along with the foregoing elements.

Figure 4A:
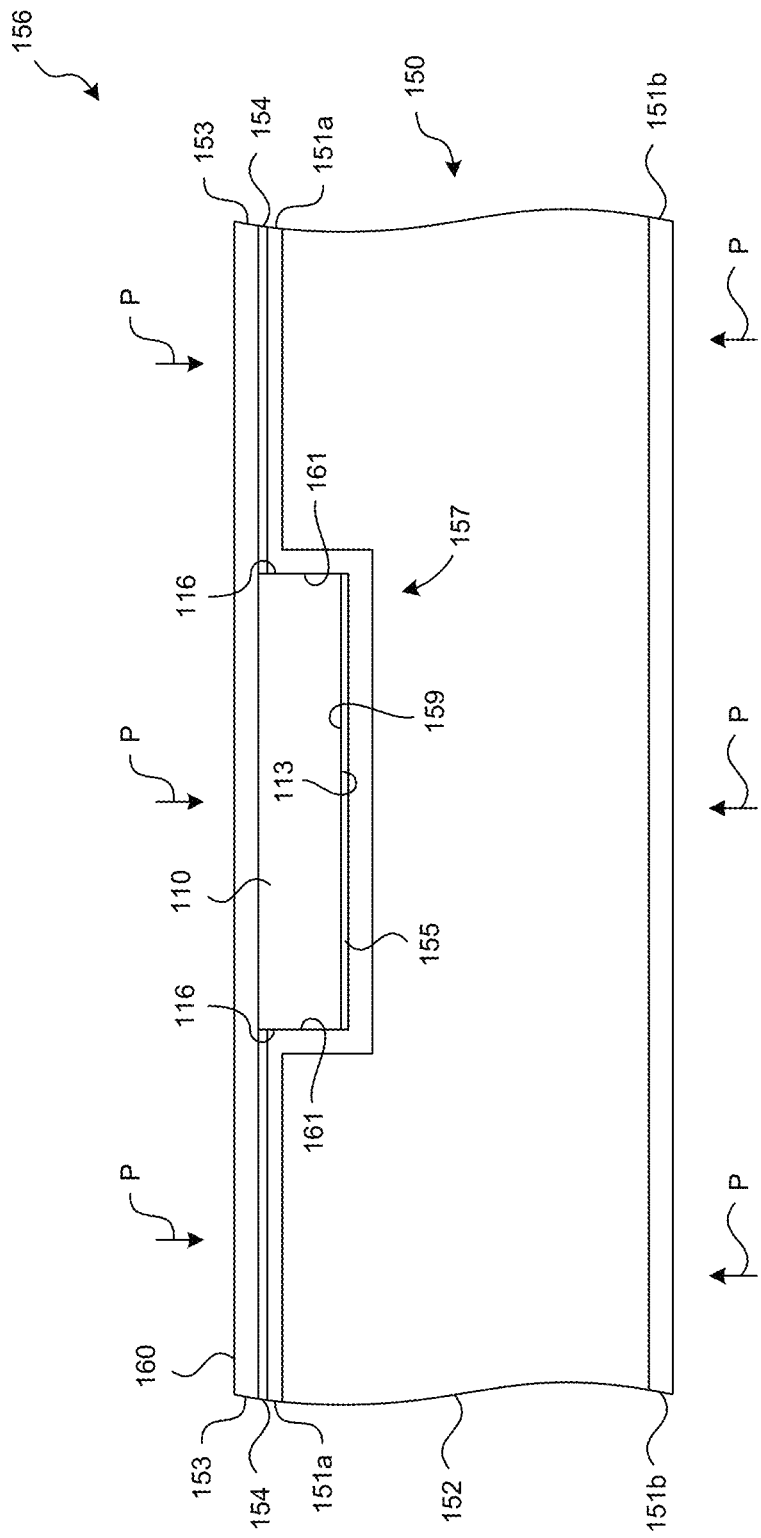
FIGS. 4A-4C illustrate cross-sectional views of substrates having integrated solar cells in accordance with embodiments of the present technology.
Figure 4B:
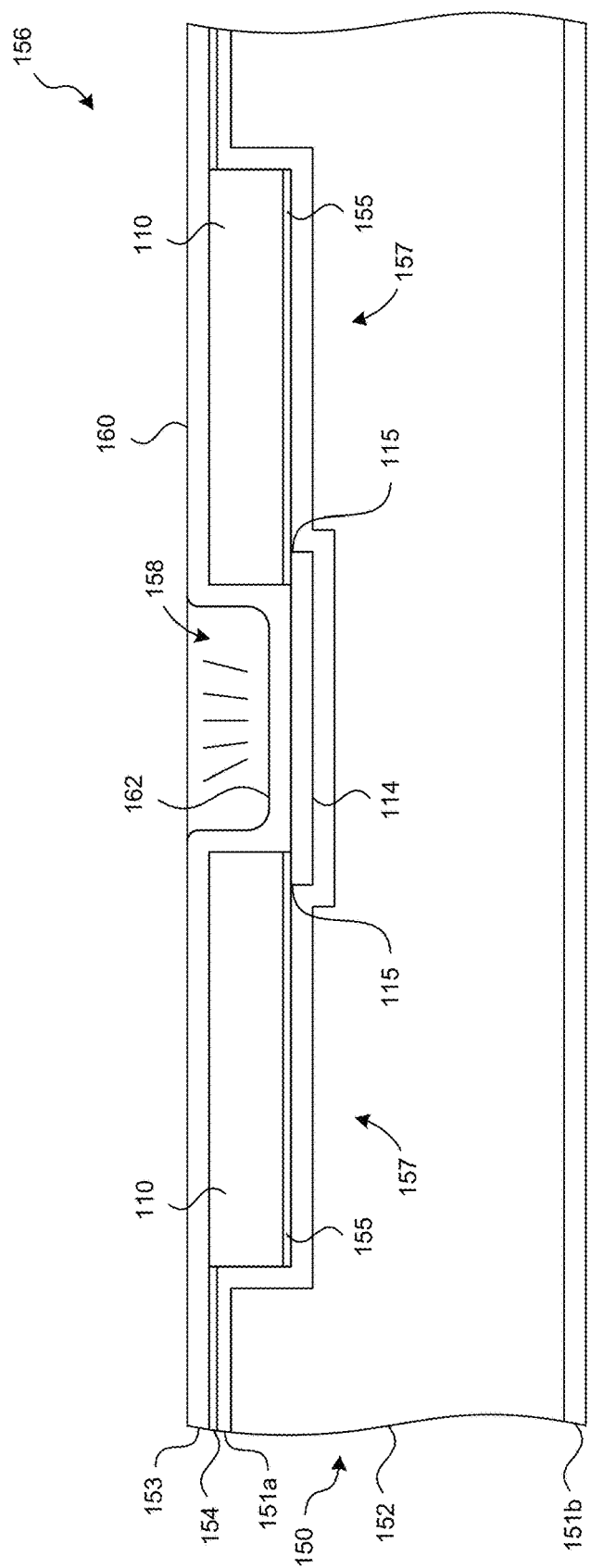
Figure 4C:
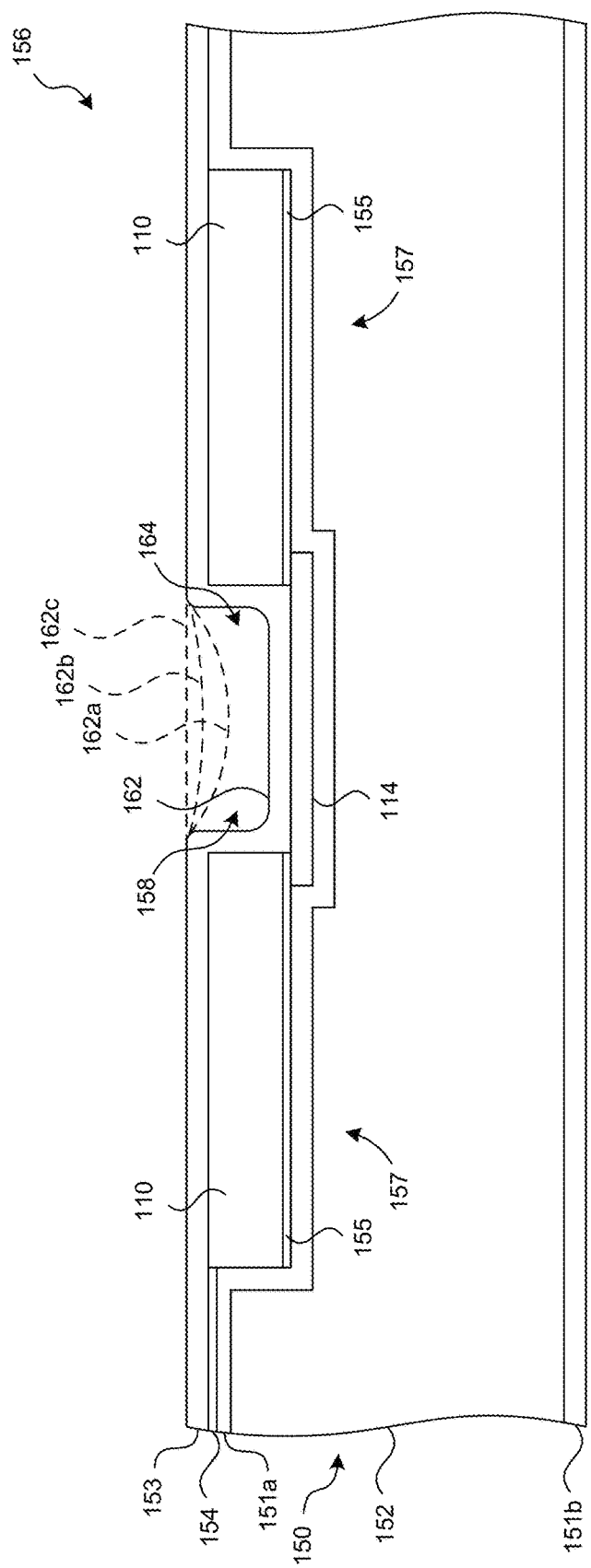

FIGS. 4A-4C illustrate representative cross-sectional views of completed assemblies 156. For purposes of illustration, only portions of the assemblies are shown in FIGS. 4A-4C, and several of the dimensions shown in FIGS. 4A-4C have been exaggerated. FIG. 4A illustrates a portion of an assembly 156 having a single solar cell 110. As shown in FIG. 4A, the pressure (indicated by arrows P) exerted by the vacuum (and/or other suitable arrangement), on the assembly 156 during the manufacturing process by can force the solar cell 110 into the underlying portions of the assembly 156. In a particular embodiment, the solar cell 110 can accordingly form and simultaneously fill a cell recess 157 that is indented into the first sheet 151a and, optionally, the core 152. For example, when the core 152 is a foam core, it can readily indent under vacuum, and when the core 152 is a honeycomb or more rigid core, the indentation may be limited to the first sheet 151a.

During the curing process, the first adhesive 154, the second adhesive 155 and/or the epoxy and/or other adhesive carried by the first sheet 151a, consolidate and bond the solar cell 110 firmly to the assembly 156. In particular, one or more of the foregoing adhesives can bond the second surface 113 of the solar cell 110 to the bottom 159 of the cell recess 157. One or more of the foregoing adhesives can bond the edge or side surfaces 116 of the solar cell 110 to corresponding walls 161 of the cell recess 157 via strong cohesive and adhesive bonds. Accordingly, the solar cell 110 becomes highly integrated with the assembly 156 that carries it.

It is expected that the foregoing arrangement will increase the overall strength of the assembly 156. In particular, the solar cells 110 can carry loads that would normally be carried by the aircraft structure. Such loads include, but are not limited to, compression loads. For example, when the assembly 156 forms part of a wing upper surface, the upper surface can be placed in compression as the wing bends upwardly. Because the solar cells 110 are intimately integrated with the assembly 156 (e.g., via direct contact between the edge/side surfaces 116 of the solar cells 110, and the adjacent walls 161 of the cell recess 157), they can carry the foregoing compression loads. Solar cells that are merely surface mounted on a wing (as is the case with some conventional arrangements) cannot suitably carry such compression loads.

Because assemblies 156 in accordance with the present technology take advantage of the load-bearing capability of the solar cells 110, other elements of the aircraft that would otherwise be required to provide this load capability can be reduced or eliminated, thus reducing the overall aircraft weight. For example, in an embodiment for which the assembly 156 forms a portion of a wing surface that is supported internally by ribs or other structural elements, the number of ribs or other structural elements can be reduced to produce a corresponding weight reduction. Reducing the aircraft weight can reduce cost, and/or can increase the endurance and/or the payload capacity of the aircraft.

In particular embodiments, the solar cells can be bare, monocrystalline solar cells, e.g., cells without encapsulants or other packaging. An advantage of monocrystalline cells (as opposed to thin film cells) is that monocrystalline cells have a high energy concentration and can accordingly produce a greater amount of energy per square meter than can thin film cells. A drawback with monocrystalline cells is that they can be very brittle and are also typically very flat. However, by integrating monocrystalline solar cells with the underlying structure in the manner described above, the brittle characteristics of the solar cell 110 can be mitigated and the support provided by the underlying and integrally connected substrate 150 can allow the solar cells 110 to bend without breaking. In particular, assemblies 156 made in accordance with the techniques described herein can be bent into a curved shape having a 1.5 foot radius, without breaking the solar cells 110 carried by the substrate 156. Even if a solar cell 110 does break under load, the presence of the underlying structural elements can be sufficient to preserve at least some of the electrical continuity provided by the solar cells 110 and the contacts 114, so that the solar cells 110 maintain at least some functionality.

FIG. 4B is a cross-sectional view of a representative assembly 156 illustrating two solar cells 110 connected by an electrical connector 114. In one aspect of this embodiment, each solar cell 110 forms a corresponding cell recess 157 as it is compacted during the manufacturing process. An inter-cell recess 158 is formed between neighboring cell recesses 157. An inter-cell recess bottom 162 is defined at least in part by the protective cover 153. If the protective cover 153 is not included in the assembly 156, the inter-cell recess bottom 162 can be defined at least in part by the electrical connector 114. In a particular embodiment, the inter-cell recess 158 is present only directly above the electrical connector 114. At positions away from the electrical connector 114 (e.g., into and out of the plane of FIG. 4B), the first sheet 151a and the core 152 can project upwardly between the solar cells 110 so that the outwardly facing surface 160 of the overall assembly 156 remains generally flat.

FIG. 4C illustrates an assembly 156 having surface contours in accordance with still further embodiments of the present technology. For purposes of comparison, the inter-cell recess bottom 162 shown in FIG. 4B is also shown in FIG. 4C, along with other potential contours for the inter-cell recess bottom, illustrated as first-third recess bottoms 162a-162c. Each of these inter-cell recess bottom contours 162a-162c can result from placing the solar cells 110 closer to each other (thus reducing the depth of the corresponding inter-cell recess 158), up to the limit indicated by the third recess bottom contour 162c, which is generally flat. In still further embodiments, the assembly 156 can include an additional filler material 164, which is placed within the inter-cell recess 158 to reduce the aerodynamic discontinuity presented by the recess, and thereby improve aerodynamic performance. However, in other embodiments, the roughness provided the inter-cell recesses 158 (which may not be visible to the naked eye) can provide aerodynamic advantages, e.g., by delaying flow separation over the wing surface. Accordingly, the size of the inter-cell recesses 158, and whether and to what extent the inter-cell recesses 158 are filled, can be selected based at least in part on the Reynold's number of local flow.

FIGS. 1A-4C and the associated discussion above describe in general terms techniques and corresponding components used to form load-bearing aircraft structures that include solar cells. The following examples provide additional details of particular embodiments for representative components and techniques.

Solar Cells

Representative solar cells in accordance with embodiments of the present technology include polycrystalline silicon cells, monocrystalline silicon cells, gallium arsenide cells, and/or other suitable solar cell constructions. In particular aspects of these embodiments, the solar cells are bare, e.g., without plastic or other mounting substrates and hardware to reduce weight and to improve the integration of the solar cells with the underlying aircraft structure. In a representative embodiment, the solar cell 110 can weigh approximately 500 grams per square meter and the underlying structure can weigh approximately 150 grams per square meter, producing a total assembly weight of approximately 650 grams per square meter. This is expected to be a significant weight reduction compared to existing solar aircraft structures which are typically at least 50% heavier. Other conventional structures, which may include solar cells sandwiched between two sheets of Mylar®, may be relatively light, but are expected to be significantly less durable than structures formed in accordance with embodiments of the present technology.

Sheets

The first and second sheets can include unwoven or woven fabric, for example, a plain weave fiberglass fabric having a weight of approximately 0.7 ounces per square yard to approximately 5.6 ounces per square yard. In other embodiments, the sheets can include a plain weave carbon fiber having a weight in the same or a similar range. In still further embodiments, the sheets can have other constructions. For example, the sheets can be formed from Kevlar® or other high strength lightweight materials. In addition to these criteria, the sheets can be selected for low cost, tolerance for environmental factors, ease of manufacturability, and formability, among others. In any of these embodiments, as discussed above, the sheets can be pre-impregnated with epoxy or another suitable adhesive, or the adhesive can be applied to the sheets at the time the assembly is manufactured. Suitable epoxies include a 105 Epoxy System available from West Systems of Bay City, Mich., having a cure time of from about 6 hours to about 24 hours based on the selection of the associated hardener. Another representative epoxy includes the MGS L285 Epoxy System, available from MGS Kunstharz Probukte Gmbh of Stuttgart, Germany. Suitable cure temperatures for these materials are within the ranges typically provided by the manufacturer.

Core

Suitable cores for placement between the sheets described above can include foam cores, e.g., Rohacell Foam Core available from Evonik Industries of Essen, Germany, or Airex Foam Core available from Airex AG of Sins, Switzerland. Other suitable cores include Nomex honeycomb core and aluminum honeycomb core, both available from HexCel of Stamford, Conn.

Protective Cover

Suitable protective covers include Coverite Microlite materials, available from Coverite of Champaign, Ill., and So-Lite available from Mountain Models of Appleton, Wis.

During a typical bonding process, the epoxy bonds quickly to the back surface 113 of the solar cell 110, thus preventing the epoxy from flowing, seeping, or leaking around or beyond the sides 116 of the solar cell where it might interfere with the ability of the solar cell 110 to receive solar radiation. Because the typical manufacturing process includes placing the assembly under vacuum during curing, bubbles tend not to form in the assembly 156. This can be a significant advantage over other bonding techniques because such bubbles, if present during manufacture, can expand and burst when the aircraft reaches high altitude, thus damaging or destroying the surrounding structure.

One feature of at least some of the foregoing embodiments described above with reference to FIGS. 1A-4C is that the aircraft can include solar cells that are intimately integrated with the aircraft structure. In particular, the solar cells can be bonded to the aircraft structure at the same time the aircraft structure itself is formed and cured. This arrangement can increase the strength of the mechanical and/or chemical bonds between the solar cells and the underlying structure, thus allowing the solar cells to form load-bearing portions of the overall structure. As discussed above, this in turn can reduce the requirements for other load-bearing structures of the aircraft which in turn can reduce the overall weight of the aircraft.

From the foregoing, it will be appreciated that specific embodiments of the present technology have been described herein for purposes of illustration, but that various modifications may be made without deviating from the technology. For example, the protective cover material, the foam core, the first and second sheets, and/or other elements of the overall structure can have compositions different than those expressly disclosed herein. In particular embodiments, the solar cells can be carried by other structures, in addition to or in lieu of the wings and stabilizers described above. Such structures can include fuselage or empennage surfaces, and/or other surfaces that are sufficiently exposed to solar indication. The aircraft can be ground-launched, dropped from other aircraft, and/or deployed in other manners. Particular embodiments of solar cells integrated with corresponding structure were described in the context of high altitude, long endurance aircraft. Other embodiments of the presently-disclosed technology can be implemented in varying manners on other aircraft and/or in the context of other structures, e.g., blimps, spacecraft, and/or other applications where low weight and low cost can provide significant advantages.

Certain aspects of the technology described in the context of particular embodiments may be combined or eliminated in other embodiments. For example, the protective coating can be eliminated in at least some embodiments for which such a coating is unnecessary, and/or the benefit of such a coating does not outweigh the cost and/or the weight of the coating. Further, while advantages associated with certain embodiments of the present technology have been described in the context of those embodiments, other embodiments may also exhibit such advantages, and not all embodiments need necessarily exhibit such advantages to fall within the scope of the present technology. Accordingly, the present disclosure and associated technology can encompass other embodiments not expressly described or shown herein. The following examples provide additional embodiments of the present technology.

What is claimed is:

1. A solar powered aircraft, comprising:
 a substrate having a curvature to form a lift surface;
 a plurality of solar cells carried by, bonded to, and impressed into the substrate; and
 electrical connections between the solar cells carried by the substrate, wherein the electrical connections link the solar cells together to power the solar powered aircraft while in flight,
 wherein the solar cells are disposed, at least partially, within recesses impressed into the substrate and wherein the substrate comprises a multi-layer structure including:
  first and second fabric layers coated in cured adhesive; and
  a center core layer disposed between and adhered to the first and second fabric layers, wherein the solar cells are impressed and extend into at least the first fabric layer and at least a portion of the center core layer and are in intimate contact with the first fabric layer, and wherein the recesses in which the solar cells are disposed intimately conform to a shape of each individual solar cell of the plurality of solar cells without intervening gaps.

2. The solar powered aircraft of claim 1, wherein the solar cells are bonded along backsides of the solar cells to bottom surfaces of the recesses and along side edges of the solar cells to side walls of the recesses with one or more adhesives to form an intimately integrated assembly that transmits loads from one solar cell to another via surrounding portions of the substrate along one or more load paths.

3. The solar powered aircraft of claim 1, wherein the cured adhesive material is cured when applying the heat and the pressure to the solar cells and the substrate to simultaneously bond and shape the solar cells and the substrate into the lift surface of the solar powered aircraft.

4. The solar powered aircraft of claim 1, further comprising:
a protective layer disposed over active surfaces of the solar cells and the substrate with an additional adhesive,
wherein the protective layer is transparent to wavelengths that activate a current generation function of the solar cells.

5. The solar powered aircraft of claim 4, wherein the solar cells are bare crystalline solar cells that are in intimate contact with the protective layer and the first fabric layer of the substrate without individual packaging surrounding each of the solar cells.

6. The solar powered aircraft of claim 1, wherein the center core layer comprises one of a foam core or a honeycomb core.

7. The solar powered aircraft of claim 1, wherein the solar cells are bare crystalline solar cells that are in intimate contact with the first fabric layer of the substrate.

8. The solar powered aircraft of claim 7, wherein the first fabric layer and the center core layer conform to a shape of each of the solar cells.

9. An aircraft, comprising:
a substrate having a curvature to form a lift surface;
a plurality of solar cells carried by, bonded to, and impressed into recesses within the substrate, wherein the substrate includes:
first and second fabric layers coated in adhesive material; and
a core layer disposed between and adhered to the first and second fabric layers; and
electrical connections between the solar cells carried by the substrate, the electrical connections coupled to link the solar cells together to provide power to the aircraft while in flight,
wherein the solar cells are bare crystalline solar cells that are in intimate contact with the first fabric layer of the substrate,
wherein the first fabric layer and the center core layer conform to a shape of each of the solar cells,
wherein the recesses in which the solar cells are disposed intimately conform to the shape of each individual bare crystalline solar cell of the plurality of bare crystalline solar cells without intervening gaps.

10. The aircraft of claim 9, wherein the solar cells are disposed, at least partially, within recesses impressed and extending into the substrate.

11. The aircraft of claim 10, wherein the solar cells are bonded along backsides of the solar cells to bottom surfaces of the recesses and along side edges of the solar cells to side walls of the recesses with one or more adhesives to form an intimately integrated assembly that transmits compressive loads from one solar cell to another via surrounding portions of the substrate along one or more load paths.

12. The aircraft of claim 11, further comprising:
a protective layer disposed over active surfaces of the solar cells and the substrate with an additional adhesive,
wherein the protective layer is transparent to wavelengths that activate a current generation function of the solar cells.

13. The aircraft of claim 12, wherein the solar cells are in intimate contact with the protective layer and the substrate without individual packaging surrounding each of the solar cells.

14. The aircraft of claim 9, wherein the adhesive material is cured when applying the heat and the pressure to the solar cells and the substrate to simultaneously bond and shape the solar cells and the substrate into the lift surface of the aircraft.

* * * * *